United States Patent

Matthews

(10) Patent No.: US 7,521,658 B2
(45) Date of Patent: Apr. 21, 2009

(54) PIXEL HAVING PHOTOCONDUCTIVE LAYERS TO ABSORB DIFFERENT RANGES OF WAVELENGTHS

(75) Inventor: James Albert Matthews, Milpitas, CA (US)

(73) Assignee: Aptina Imaging Corporation, Grand Cayman (KY)

( * ) Notice: Subject to any disclaimer, the term of this patent is extended or adjusted under 35 U.S.C. 154(b) by 42 days.

(21) Appl. No.: 11/291,257

(22) Filed: Dec. 1, 2005

(65) Prior Publication Data

US 2007/0125934 A1 Jun. 7, 2007

(51) Int. Cl.
*H01L 27/00* (2006.01)
(52) U.S. Cl. .................. 250/208.1; 250/214.1; 257/440
(58) Field of Classification Search ................ 257/440; 250/208.1
See application file for complete search history.

(56) References Cited

U.S. PATENT DOCUMENTS

| | | | | |
|---|---|---|---|---|
| 5,023,944 A | * | 6/1991 | Bradley | 359/107 |
| 5,557,133 A | * | 9/1996 | de Cesare et al. | 257/440 |
| 5,965,875 A | * | 10/1999 | Merrill | 250/226 |
| 6,157,020 A | * | 12/2000 | Krapf et al. | 250/214 LA |
| 6,407,439 B1 | * | 6/2002 | Hier et al. | 257/440 |
| 6,580,089 B2 | * | 6/2003 | Bandara et al. | 257/14 |
| 6,632,701 B2 | | 10/2003 | Merrill | |
| 6,727,521 B2 | | 4/2004 | Merrill | |
| 6,841,816 B2 | | 1/2005 | Merrill et al. | |
| 6,864,557 B2 | | 3/2005 | Turner et al. | |
| 6,894,265 B2 | | 5/2005 | Merrill et al. | |
| 6,914,314 B2 | | 7/2005 | Merrill et al. | |
| 2004/0259010 A1 | * | 12/2004 | Kanbe | 430/67 |
| 2005/0109917 A1 | * | 5/2005 | Wong | 250/208.1 |
| 2005/0205903 A1 | * | 9/2005 | Hioki | 257/291 |
| 2006/0091284 A1 | * | 5/2006 | Viens et al. | 250/201.9 |

FOREIGN PATENT DOCUMENTS

| | | | | |
|---|---|---|---|---|
| JP | 63170978 A | * | 7/1988 | |
| JP | 03120764 A | * | 5/1991 | |

* cited by examiner

*Primary Examiner*—Seung C Sohn
(74) *Attorney, Agent, or Firm*—Ratner Prestia

(57) ABSTRACT

A pixel including a substrate and a plurality of photoconductive layers sequentially deposited on and substantially parallel to the substrate and configured to receive incident electromagnetic radiation. Each photoconductive layer is configured to absorb a different wavelength range of the incident electromagnetic radiation and configured to provide an indication of an amount of incident electromagnetic radiation within the corresponding wavelength range absorbed by the layer based on a change in the conductance of the layer.

25 Claims, 9 Drawing Sheets

PIXEL HAVING PHOTOCONDUCTIVE LAYERS TO ABSORB DIFFERENT RANGES OF WAVELENGTHS

BACKGROUND

In a typical color camera image sensor, three individual pixels are employed to form a single color pixel, with each individual pixel having either a red, green, or blue transmission filter placed over it so as to sensitize the pixel to the color its filter passes and desensitize it to the colors its filter blocks. The underlying semiconductor light sensor is typically a photovoltaic sensor (i.e., a photodiode) or a charge coupled device (CCD).

While such image sensors are widely used, they have several shortcomings. First, because three "basic" pixels are required to make one color pixel, such image sensors require a large chip area. For example, a 1 megapixel color camera image sensor requires a 3 megapixel "black and white" image sensor. Also, since a color pixel is actually a small array and not a "point", such image sensors are sensitive to various imaging artifacts, such as "herringbone" effects, when imaging a fine regular pattern. Furthermore, the transmission filters are typically organic (e.g., plastic) dye-based and are not very temperature stable, are prone to bleaching, and are expensive.

In attempts to overcome these shortcomings, one color image sensor employs a vertically oriented stack of three separate photodiodes to form a single color pixel, with each of the three photodiodes consisting of p-n junctions formed from p- and n-doped semiconductor materials and each absorbing either red, green, or blue light. Because of the vertical nature of the pixel, both the size of the image sensor and imaging artifacts associated with differential absorption of light are substantially reduced. Additionally, because filtering is performed by the semiconductor materials forming the photodiodes, transmission filters are not required.

However, the operation of p-n junctions are very sensitive to defects in the crystalline structure of the semiconductors, which can cause electron-hole pairs formed by the absorption of incident light to recombine and generate heat rather than the desired photovoltaic effect. As such, formation of such photodiodes must be carefully controlled and, for best results, generally requires the use of single crystalline semiconductors. Additionally, formation of p-n junctions generally occurs at relatively high temperatures using diffusion or ion-implantation processes and are often sensitive of the type of substrate employed. Depending on the depth of the p-n junctions, epitaxial processes may also be required. As a result of the typically high temperatures required to form the p-n junctions, certain materials (e.g., glass and plastic) may not be used as the substrate material. Furthermore, certain semiconductor materials are not available in either p-type or n-type form and, thus, cannot be employed for use in photodiodes.

SUMMARY

One aspect of the present invention provides a pixel including a substrate and a plurality of photoconductive layers sequentially deposited on and substantially parallel to the substrate and configured to receive incident electromagnetic radiation. Each photoconductive layer is configured to absorb a different wavelength range of the incident electromagnetic radiation and configured to provide an indication of an amount of incident electromagnetic radiation within the corresponding wavelength range absorbed by the layer based on a change in the conductance of the layer.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
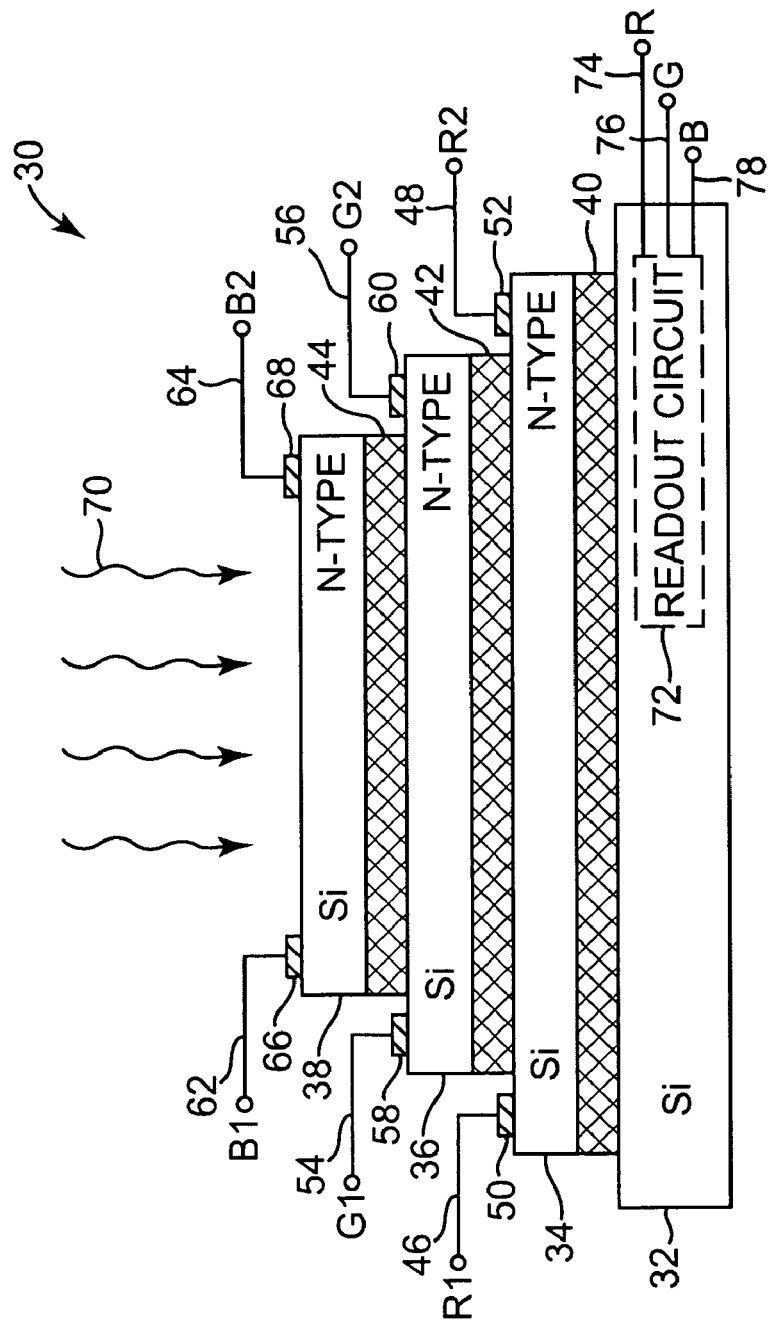
FIG. 1 is a block and schematic diagram illustrating one embodiment of a pixel according to the present invention.

FIG. 1 is a block and schematic diagram illustrating generally one embodiment of a pixel 30 employing photoconductive layers according to the present invention. Pixel 30 includes a substrate 32, a first photoconductive layer 34, a second photoconductive layer 36, and a third photoconductive layer 38. In one embodiment, substrate 32 consists of a semiconductor material. In one embodiment, with reference to FIG. 1, substrate 32 consists of silicon. In other embodiments, as will be described in greater detail below, substrate 32 may consist of other material, such as glass or plastic, for example.

In one embodiment, first, second, and third semiconductor layers 34, 36, and 38 each consist of a semiconductor material. In one embodiment, as shown in FIG. 1, first, second, and third semiconductor layers 34, 36, and 38 each consist of n-type silicon. In other embodiments, first, second, and third semiconductor layers 34, 36, and 38 may consist of any suitable material having a conductance which varies in response to absorbing electromagnetic radiation (i.e., a photoconductive material).

Insulating layers 40, 42 and 44 are respectively positioned between substrate 32 and first semiconductor layer 34, between first and second semiconductor layers 34 and 36, and between second and third semiconductor layers 36 and 38. In one embodiment, insulating layers 40, 42, and 44 consist of dielectric materials which support and electrically isolate first, second, and third semiconductors layers 34, 36, and 38 from one another and from substrate 32.

Leads 46 and 48 are respectively coupled to opposite ends of first semiconductor layer 34 via metal contacts 50 and 52 deposited on first semiconductor layer 34. Leads 54 and 56 are respectively coupled to opposite ends of second semiconductor layer 36 via metal contacts 58 and 60 deposited on second semiconductor layer 36. Leads 62 and 64 are respectively coupled to opposite ends of third semiconductor layer 38 via metal contacts 66 and 68 deposited on third semiconductor layer 38.

Pixel 30 is configured to receive incident electromagnetic radiation 70 consisting of a range of wavelengths. In one embodiment, pixel 30 is configured to receive incident electromagnetic radiation 70 during an integration period. In one embodiment, incident electromagnetic radiation 70 consists of light from the visible portion of the electromagnetic spectrum (i.e., wavelengths from approximately 700 nm to approximately 400 nm). In other embodiments, incident electromagnetic radiation 70 may consist of wavelengths from the ultraviolet portion of the electromagnetic spectrum (approximately 400 nm to 10 nm) and from the infrared portion of the electromagnetic spectrum (approximately 1 mm to approximately 750 nm).

The conductance of a photoconductive material, such as first, second, and third semiconductor layers 34, 36, and 38, varies in response to absorbing electromagnetic radiation. Typically, the resistance of a semiconductor material, including silicon, decreases upon absorbing electromagnetic radiation having an energy greater than a band gap energy of the photoconductive material, resulting in an increase the electrical conductivity of the semiconductor material.

Electromagnetic radiation penetrates to and is absorbed at different depths within a semiconductor material based on the energy of the electromagnetic radiation. If the energy of the electromagnetic radiation is greater than a bandgap energy of the semiconductor material, the electromagnetic radiation is absorbed by the semiconductor material. The more the energy of the electromagnetic radiation exceeds the bandgap energy of the semiconductor material, the more rapidly the electromagnetic radiation will be absorbed. Additionally, because the energy of the electromagnetic radiation is generally related to its wavelength, with shorter wavelengths generally having a higher energy than longer wavelengths, longer wavelengths generally penetrate to and are absorbed at greater depths within the semiconductor material than shorter wavelengths.

Figure 2A:
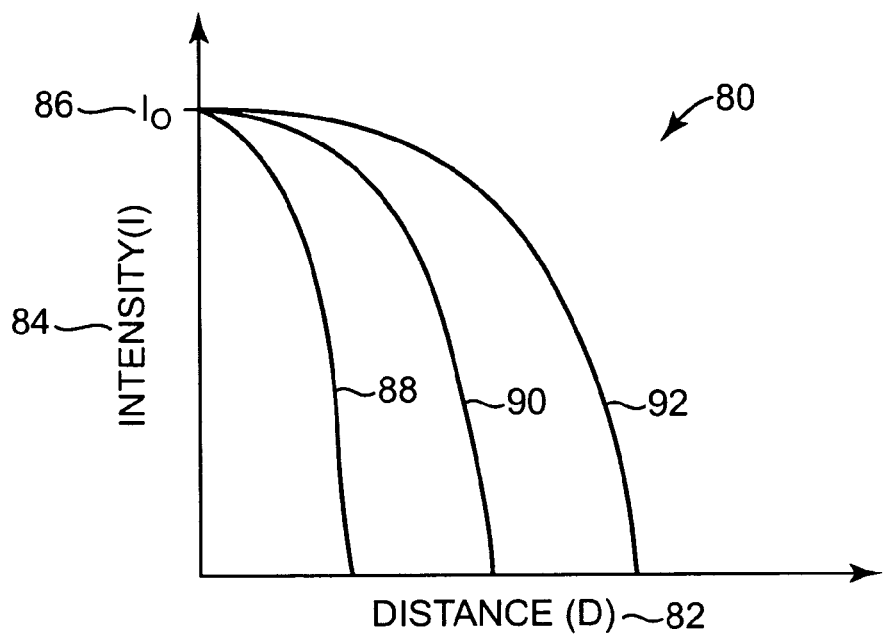
FIG. 2A is a graph illustrating light absorption characteristics of a semiconductor material.

FIG. 2A is graph 80 illustrating generally the light absorption characteristics of a bulk specimen of a semiconductor material, such as silicon, for example, for various wavelengths of visible light incident upon the semiconductor material. The depth of penetration (D) 82 of the light into the bulk semiconductor material is illustrated along the x-axis. A relative intensity (I) 84 of the incident light is illustrated along the y-axis, with an incident intensity ($I_O$) indicated at 86. Curve 88 illustrates the absorption of blue light (approximately 450 nm wavelength), curve 90 illustrates the absorption of green light (approximately 550 nm wavelength), and curve 92 illustrates the absorption of red light (approximately 650 nm wavelength). As illustrated, the higher energy blue light 88 is absorbed more rapidly than the lower energy green and red light, 90 and 92, which penetrate more deeply into the semiconductor material before being absorbed.

Figure 2B:
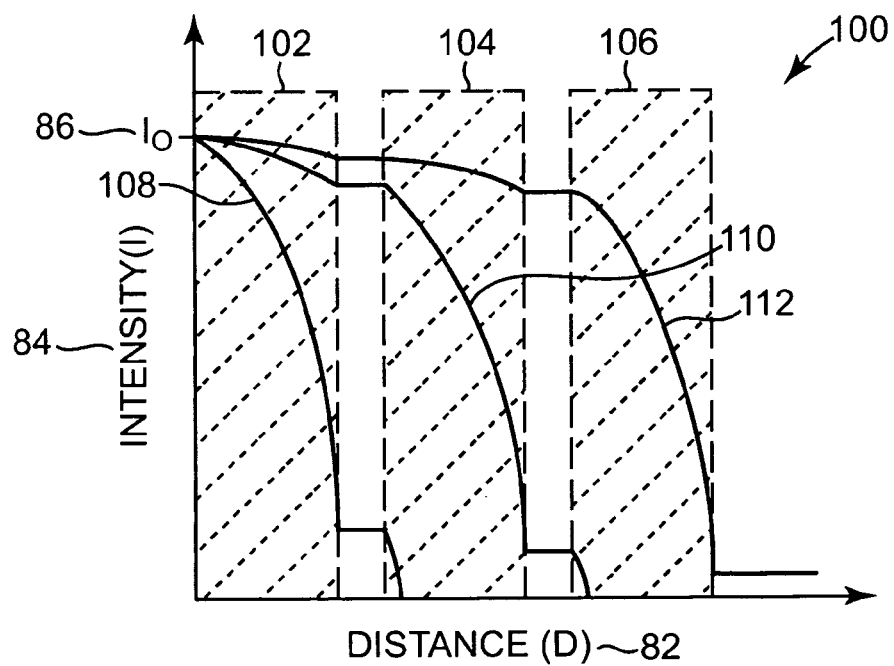
FIG. 2B is a graph illustrating the light absorption characteristics of a semiconductor material.

While FIG. 2A illustrates the absorption properties of a bulk specimen of a semiconductor material, the semiconductor material need not be continuous to absorb the incident light. FIG. 2B is graph 100 illustrating the light absorption characteristics of the semiconductor material of FIG. 2A, wherein the semiconductor layer consists of three layers, illustrated as layers 102, 104, and 106. Curve 108 illustrates the absorption of blue light (approximately 450 nm wavelength), curve 110 illustrates the absorption of green light (approximately 550 nm wavelength), and curve 112 illustrates the absorption of red light (approximately 650 nm wavelength). The absorption of light is similar to that illustrated by FIG. 2A, except that no light is absorbed between the layers. With regard to FIG. 2B, the depth of the layers is such that the blue light is mostly absorbed by layer 102, the green light is mostly absorbed by layer 104, and the red light is mostly absorbed by layer 106.

Returning to FIG. 1, in one embodiment, first, second, and third semiconductor layers 34, 36, and 38 are each configured to absorb a different range of wavelengths of electromagnetic radiation. In one embodiment, each semiconductor layer is configured to absorb a different portion of the visible portion of the electromagnetic spectrum (approximately 400 nm to approximately 700 nm), with first semiconductor layer 34 configured to absorb mostly red light (approximately 650 nm wavelength), second semiconductor layer 36 configured to absorb mostly green light (approximately 550 nm wavelength), and third semiconductor layer 38 configured to absorb mostly blue light (approximately 450 nm wavelength).

In one embodiment, insulating layers 40, 42, and 44 consist of optically transparent dielectric material (i.e., absorb substantially no electromagnetic radiation. In one embodiment, insulating layers 40, 42, and 44 consist of silicon oxide ($SiO_2$). In one embodiment, insulating layers 40, 42, and 44 consist of silicon nitride ($Si_3N_4$).

In one embodiment, pixel 30 receives electromagnetic radiation 70 during an integration period, with first, second, and third semiconductor layers 34, 36, and 38 absorbing light substantially within their respective range of wavelengths. In a fashion similar to that described above, the conductivity of first, second, and third semiconductor layers 34, 36, and 38 changes based respectively on the amount of red, green, and blue light absorbed by each layer. In one embodiment, the change in conductivity of first, second, and third semiconductor layers 34, 36, and 38, and, thus, the amount of red, green and blue light absorbed during an integration period is respectively determined by monitoring the resistance of first, second, and third semiconductor layers 34, 36, and 38 via leads 62 and 64, 54 and 56, and 46 and 48. In one embodiment, as will be described in greater detail below, the resistance of first, second, and third semiconductor layers 34, 36, and 38 is monitored by a readout circuit 72 formed in silicon substrate 32 below first, second, and third semiconductor layers 34, 36, and 38.

Figure 3:
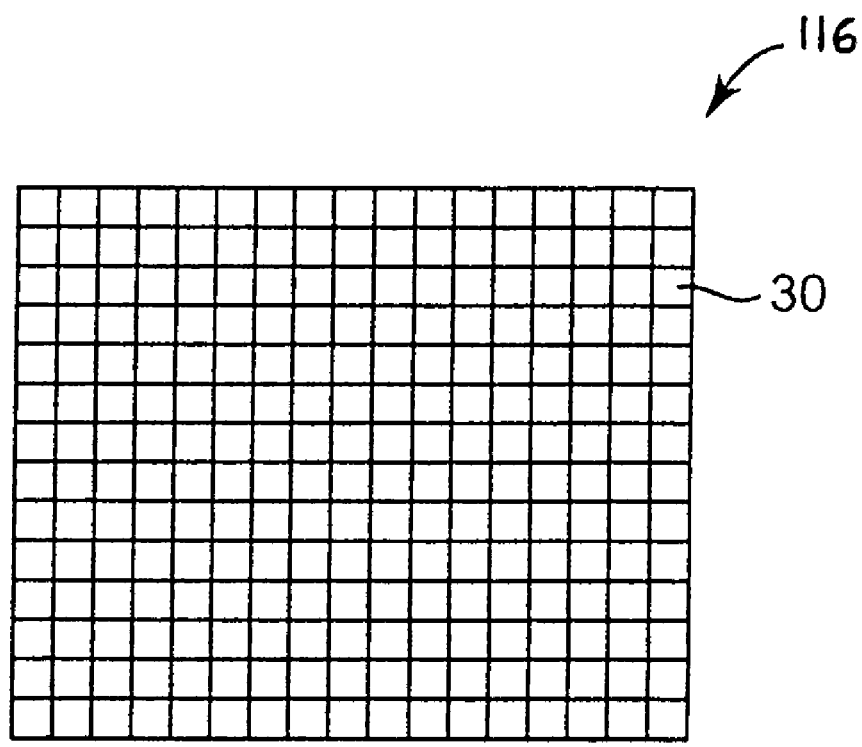
FIG. 3 is a block diagram illustrating an array of pixels according to one embodiment of the present invention.

In one embodiment, the amount of red, green, and blue light respectively absorbed during the integration period by first, second, and third semiconductor layers 34, 36, and 38 is determined by readout circuit 72 based on the corresponding change in conductivity and provided as electronic signals via outputs 74, 76, and 78. As such, pixel 30, as described above with respect to FIG. 1, can be referred to as a 3-color (RGB) pixel. An array 116 of 3- color pixels 30, as illustrated generally by FIG. 3, can be employed to form an image sensor, such as in a digital camera, with the electronic signals provided via outputs 74, 76, 78 of each pixel 30 being used to form digital color images. A single 3-color pixel 30 can be employed to form a color sensor to control a "white" light source.

Because pixel 30 employs photoconductive layers in accordance with the present invention, such as first, second, and third semiconductor layers 34, 36, and 38, and is based on the photoconductive effect, pixel 30 does not require p-n junctions as do conventional photovoltaic-based sensors employing photodiodes. As a result, pixel 30 provides several advantages over such conventional sensors.

First, because the photoconductive effect is generally not sensitive to semiconductor defects, pixel 30 can be formed using polycrystalline and other types of semiconductors, and is not limited to use with single crystal semiconductors, as is generally the case with photovoltaic-based sensors employing p-n junctions. For example, in one exemplary embodiment, first, second, and third semiconductor layers 34, 36, and 38 of pixel 30 are formed using amorphous hydrogenated silicon (α-Si:H).

Also, pixel 30 can be formed using semiconductor materials that are difficult or possible to make a p-type materials and, thus, generally not able to be employed by photovoltaic-based sensors. Examples of such semiconductor materials include cadmium sulphide, carbon (diamond), and silicon carbide, the latter two of which, as will be described in greater detail below, are generally well-suited for absorbing ultraviolet radiation.

Additionally, the semiconductor layers of pixel 30, such as first, second, and third semiconductor layers 34, 36, and 38, can be formed using relatively simple and inexpensive thin-film deposition techniques as opposed to diffusion, ion implantation, and epitaxial processes generally required for the proper formation of p-n junctions. In one embodiment, for example, the semiconductor layers of pixel 30 may be formed using electroplating techniques. Other conventional thin-film deposition techniques may be employed as well, such as sputtering deposition techniques, evaporation deposition techniques, and chemical vapor deposition techniques, for example.

Because such thin-film deposition techniques can be performed at low temperatures, substrate 32 of pixel 30 may consist of low-cost materials such as glass and plastic which typically can not be used at the generally high temperatures associated with the formation of p-n junctions. Other substrate materials can be employed as well, such as, for example, ceramics, metals, plastic composites (e.g., fiberglass) and other dielectric materials on which the semiconductor layers can be deposited.

By using such thin-film deposition techniques, and as will be described in greater detail below, each of the semiconductor layers of pixel 30 may consist of different semiconductor materials tailored to absorb different ranges of wavelengths of visible light or ranges of wavelength from other portions of the electromagnetic spectrum (e.g., infrared and ultraviolet). Examples of semiconductor materials include carbon (diamond) and silicon carbide (which are well-suited for absorbing UV radiation), germanium (which is suited for absorbing near-IR radiation, mercury cadmium telluride (which is suited for absorbing mid-IR radiation), and gallium nitride (which is suited for absorbing far-IR radiation). Other semiconductor materials include germanium silicon alloys (which have a variable band gap energy depending on the alloy ration), gallium arsenide, and gallium nitride.

By depositing the photoconductive layers, such as first, second, and third photoconductive layers 34, 36, and 38 on top of substrate 32, pixel 30 enables readout and signal processing circuitry, such as readout circuit 72, to be integrated in substrate 32 below the layers. As such, signal readout and a significant amount of signal processing can be performed local to pixel 30 which enables image sensors to be more compact when employing an array of pixels 30, such as array 116.

Employing photoconductive layers sequentially deposited on and substantially in parallel with a substrate, pixel 30 according to embodiments of the present invention provides color imaging with a single "vertical" color pixel as opposed the three separate laterally disposed single-color pixels of most conventional image sensors. Additionally, utilizing the photoconductive properties of semiconductors, pixel 30 according to embodiments of the present invention is easier and less expensive to manufacture and is more tolerant of semiconductor defects (i.e., not limited to single crystalline semiconductors) than "vertical" pixels utilizing the photovoltaic effect and requiring the formation of p-n junctions.

Figure 4:
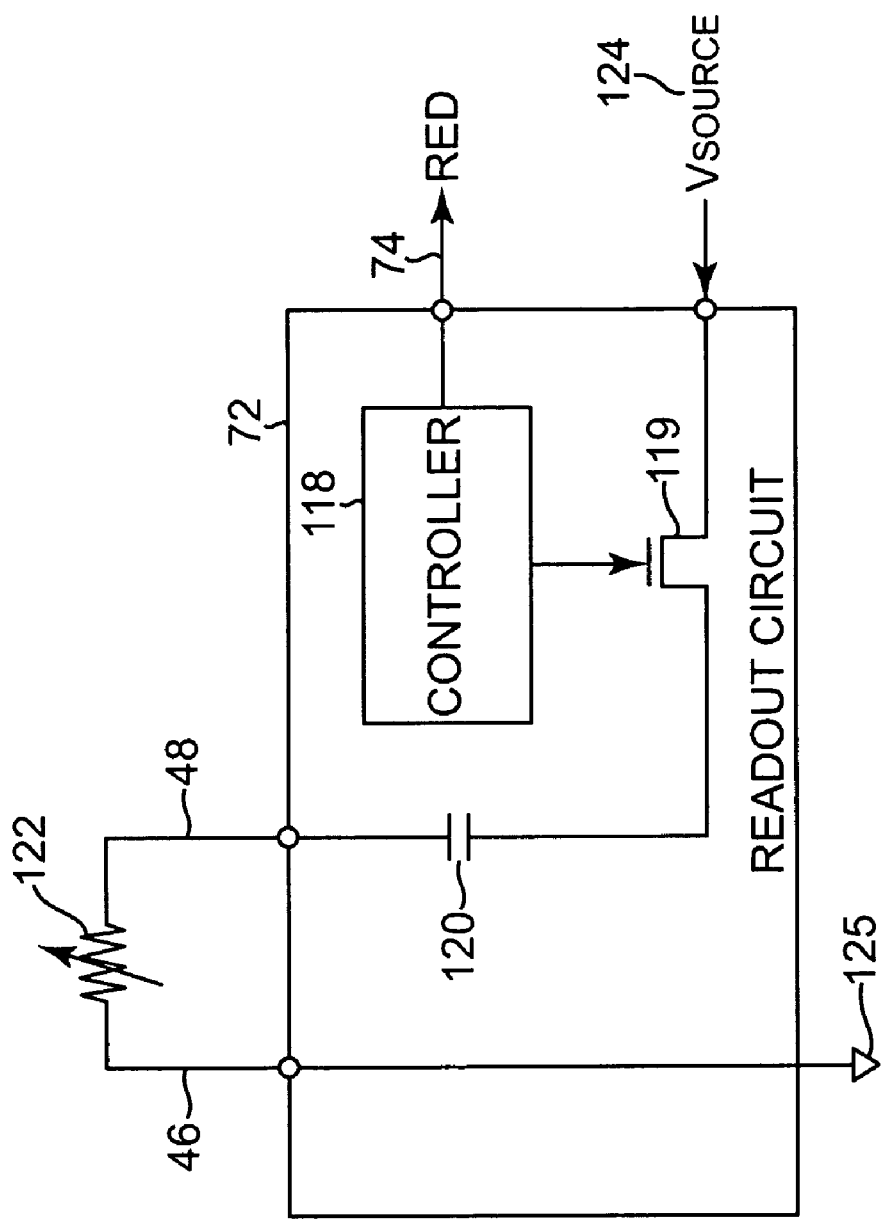
FIG. 4 is a block and schematic diagram illustrating one example embodiment of a readout circuit of a pixel according to the present invention.

FIG. 4 illustrates one example embodiment of a portion of readout circuit 72 with further reference to FIG. 1. Readout circuit 72 includes a controller 118, a switch 119 (e.g., a transistor), and a readout capacitor 120. Readout circuit 72 is coupled across first semiconductor layer 34 via leads 46 and 48, with variable resistance 122 representative of the variable resistance of first semiconductor layer 34. Readout circuit is additionally coupled to a constant voltage source 124 and to common or ground, as indicated at 125. In one embodiment, prior to an integration period, switch 119 is an "open" position so that readout capacitor 120 is discharged.

Upon initiation of an integration period, controller 118 closes switch 119 so as to couple readout capacitor 120 to voltage source 124 and complete a circuit through variable resistance 122 of first semiconductor layer 34 to ground 125. As electromagnetic radiation 70 in the form of visible light is incident upon pixel 30, first semiconductor layer 34 begins absorbing red light causing the resistance of variable resistance 122 to vary. During the integration period, readout capacitor 120 begins to accumulate a charge, with the amount of accumulated charge depending on the resistance of variable resistance 122 and, thus, on the amount of red light absorbed by first semiconductor layer 34.

At completion of the integration period, controller 118 opens switch 119 and decouples voltage source 124 from readout capacitor 120. Subsequently, controller 118 determines the accumulated charge on readout capacitor 120 and provides an electronic signal at 74 based on the accumulated charge and representative of the amount of red light absorbed by first semiconductor layer 34 during the integration period. Although not indicated, a readout capacitor similar to readout capacitor 120 is associated with and coupled to each of the second and third semiconductor layers 36 and 38 and monitored by controller 118 to provide electronic signals at 76 and 78 which are indicative of the green and blue light absorbed during the integration period by second and third semiconductor layers 36 and 38.

It is noted that readout circuit 72 as illustrated above by FIG. 4 is similar to a one-transistor one-capacitor (1T1C) memory cell commonly employed in dynamic random access memory (DRAM) architectures. It is also noted that readout circuit 72 of FIG. 4 is included for illustrative purposes only and that any number of architectures and structures may be employed to monitor the conductance and determine the amount of light absorbed by first, second and third semiconductor layers 34, 36, and 38 during the integration period.

Although pixel 30 as described above with respect to FIG. 1 through 4 is a 3-color sensor, a pixel employing photoconductive layers according to the present invention may be configured to sense more than or fewer than three colors.

Figure 5:
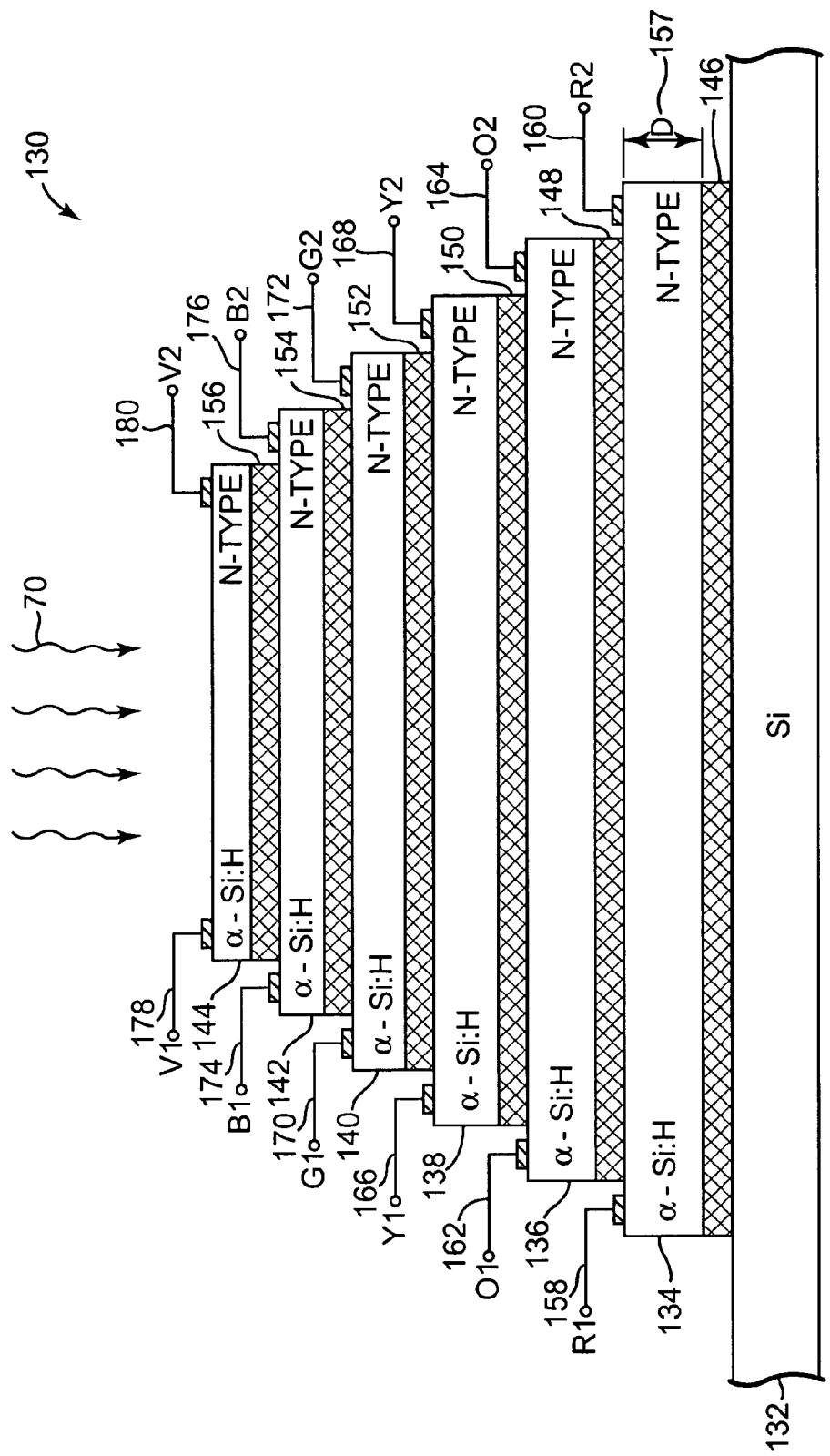
FIG. 5 is a block and schematic diagram illustrating one embodiment of a pixel according to the present invention.

FIG. 5 is a block diagram illustrating generally one embodiment of a 6-color pixel 130 according to the present invention. Pixel 130 includes a substrate 132, a first semiconductor layer 134, a second semiconductor layer 136, a third semiconductor layer 138, a fourth semiconductor layer 140, a fifth semiconductor layer 142, and a sixth semiconductor layer 144. Insulating layers 146, 148, 150, 152, 154, and 156 support the semiconductor layers and electrically isolate the semiconductor layers from one another and from substrate 132. In one embodiment, insulating layers 146, 148, 150, 152, 154, and 156 consist of an optically transparent dielectric material, such as silicon oxide ($SiO_2$) and silicon nitride ($Si_3N_4$), for example.

In one embodiment, pixel 30 is configured to receive incident electromagnetic radiation 70 consisting of light from the visible portion of the electromagnetic spectrum. In one embodiment, each of the first through sixth semiconductor layers 134, 136, 138, 140, 142, and 144 is configured to absorb a different range of wavelengths of visible light. In one embodiment, first semiconductor layer 134 is configured to absorb mostly red light ($\alpha$ 680 nm wavelength), second semiconductor layer 136 is configured to absorb mostly orange light ($\alpha$ 610 nm wavelength), third semiconductor layer 138 is configured to absorb mostly yellow light ($\alpha$ 580 nm wavelength), fourth semiconductor layer 140 is configured to absorb mostly green light ($\alpha$ 550 nm wavelength), fifth semiconductor layer 142 is configured to absorb mostly blue light ($\alpha$ 470 nm wavelength), and sixth semiconductor layer 144 is configured to absorb mostly violet light ($\alpha$ 400 nm wavelength).

In one embodiment, as shown in FIG. 5, first through sixth semiconductor layers 134, 136, 138, 140, 142, and 144 each comprise an n-type amorphous hydrogenated silicon ($\alpha$-Si:H). In one embodiment, a thickness or depth of each of the first through sixth semiconductor layers 134, 136, 138, 140, 142, and 144, as illustrated by depth (D) 157 of first semiconductor layer 134, increases with proximity to substrate 132 so as to enable each semiconductor layer to absorb the increasingly longer wavelengths of incident visible light 70 that penetrate more deeply into pixel 130.

Lead pairs 158 (R1) and 160 (R2), 162 (O1) and 164 (O2), 166 (Y1) and 168 (Y2), 170 (G1) and 172 (G2), 174 (B1) and 176 (B2), and 178 (V1) and 180 (V2) are respectively coupled to opposite sides of first through sixth semiconductor layers 134, 136, 138, 140, 142, and 144 and enable the conductance of the corresponding semiconductor layer to be monitored so as to determine an amount of incident light 70 absorbed by each semiconductor layer during an integration period, such as in a fashion similar to that described above with respect to FIGS. 1 and 4.

Although illustrated in FIG. 5 as consisting of n-type amorphous hydrogenated silicon ($\alpha$-Si:H), first through sixth semiconductor layers 134, 136, 138, 140, 142, and 144 are not limited to this material and may consist of other semiconductor material including p-type, n-type, and intrinsically doped semiconductor materials. Additionally, although the semiconductor layers of 3-color pixel 30 illustrated by FIG. 1 and 6-color pixel 130 illustrated by FIG. 5 describe each of the semiconductors layers consisting of a same semiconductor material, the semiconductors layers of a pixel, such as first, second, and third semiconductor layers 34, 38, and 38 of pixel 30, may each comprise a different type of semiconductor material.

Figure 6:
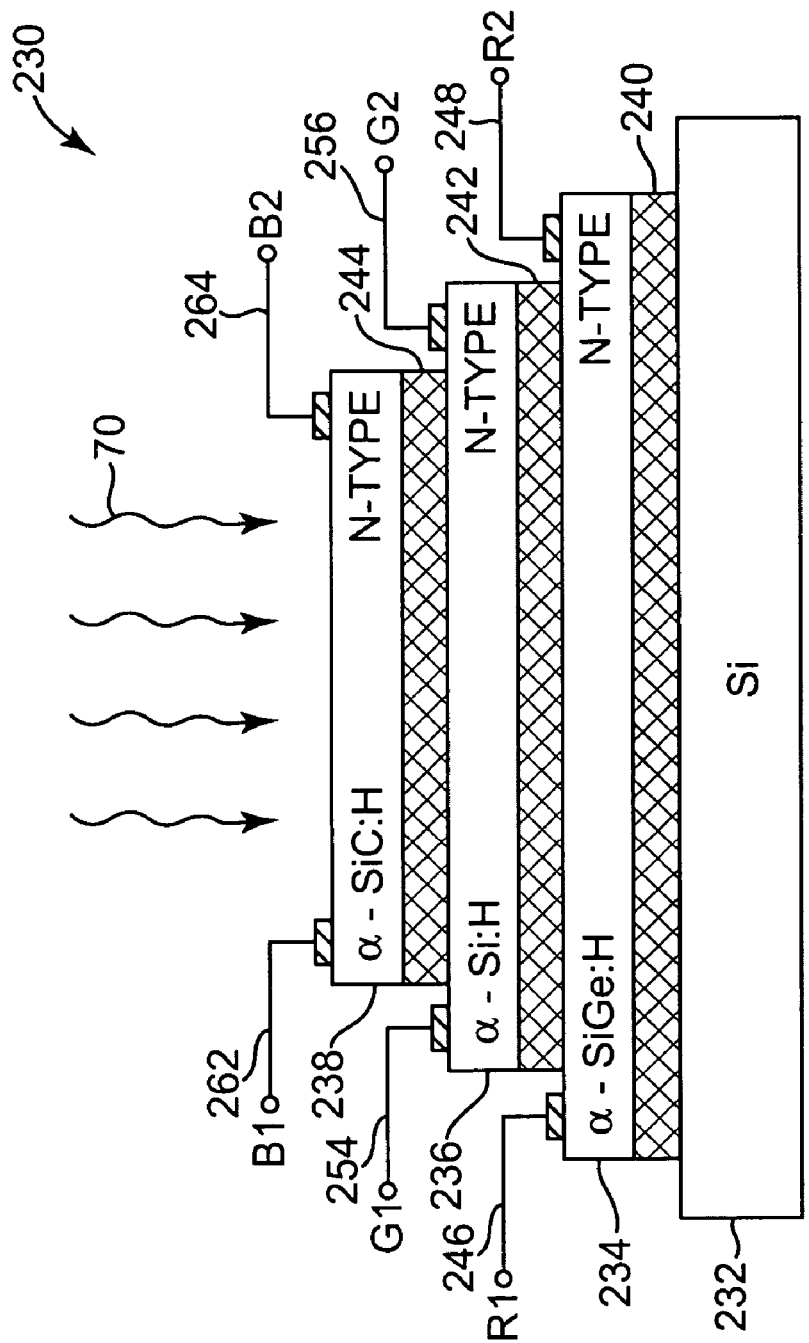
FIG. 6 is a block and schematic diagram illustrating one embodiment of a pixel according to the present invention.

FIG. 6 is a block diagram illustrating generally one embodiment of a 3-color (RGB) pixel 230 according to the present invention, wherein each of the semiconductor layers consists of a different semiconductor material having differing bandgap energies. Pixel 230 includes a substrate 232, a first semiconductor layer 234, a second semiconductor layer 236, and a third semiconductor layer 238, and insulating layers 240, 242, and 244.

In one embodiment, first, second, and third semiconductor layers 234, 236, and 238 each consist of a different semiconductor material having a different bandgap energy such that the bandgap energy of third semiconductor layer 238 is greater than the bandgap energy of second semiconductor layer 236, and the bandgap energy of second semiconductor layer 236 is greater than the bandgap energy of first semiconductor layer 234. In other words, the bandgap energy of first, second, and third semiconductor layers 234, 236, and 238 decreases with increasing proximity to substrate 232.

In one embodiment, third semiconductor layer 238 consists of a semiconductor material having a bandgap energy configured to absorb mostly blue light ($\alpha$ 450 nm wavelength) and to pass all other wavelengths. In one embodiment, third semiconductor layer 238 consists of amorphous hydrogenated silicon carbide ($\alpha$-SiC:H). In one embodiment, second semiconductor layer 236 consists of a semiconductor material having a bandgap energy configured to absorb mostly green light ($\alpha$ 550 nm wavelength) and to pass all other wavelengths. In one embodiment, second semiconductor layer 236 consists of amorphous hydrogenated silicon ($\alpha$-Si:H). In one embodiment, first semiconductor layer 234 consists of a semiconductor material having a bandgap energy configured to absorb mostly red light ($\alpha$ 650 nm wavelength) and to pass all other wavelengths. In one embodiment, first semiconductor layer 234 consists of amorphous hydrogenated silicon germanium ($\alpha$-SiGe:H).

Lead pairs 246 (R1) and 248 (R2), 254 (G1) and 256 (G2), and 262 (B1) and 264 (B2) are respectively coupled to opposite sides of first, second and third semiconductor layers 234, 236, and 238 and enable the conductance of the corresponding semiconductor layers to be monitored so as to determine an amount of incident light 70 absorbed by each semiconductor layer during an integration period, such as in a fashion similar to that described above with respect to FIGS. 1 and 4.

Figure 7:
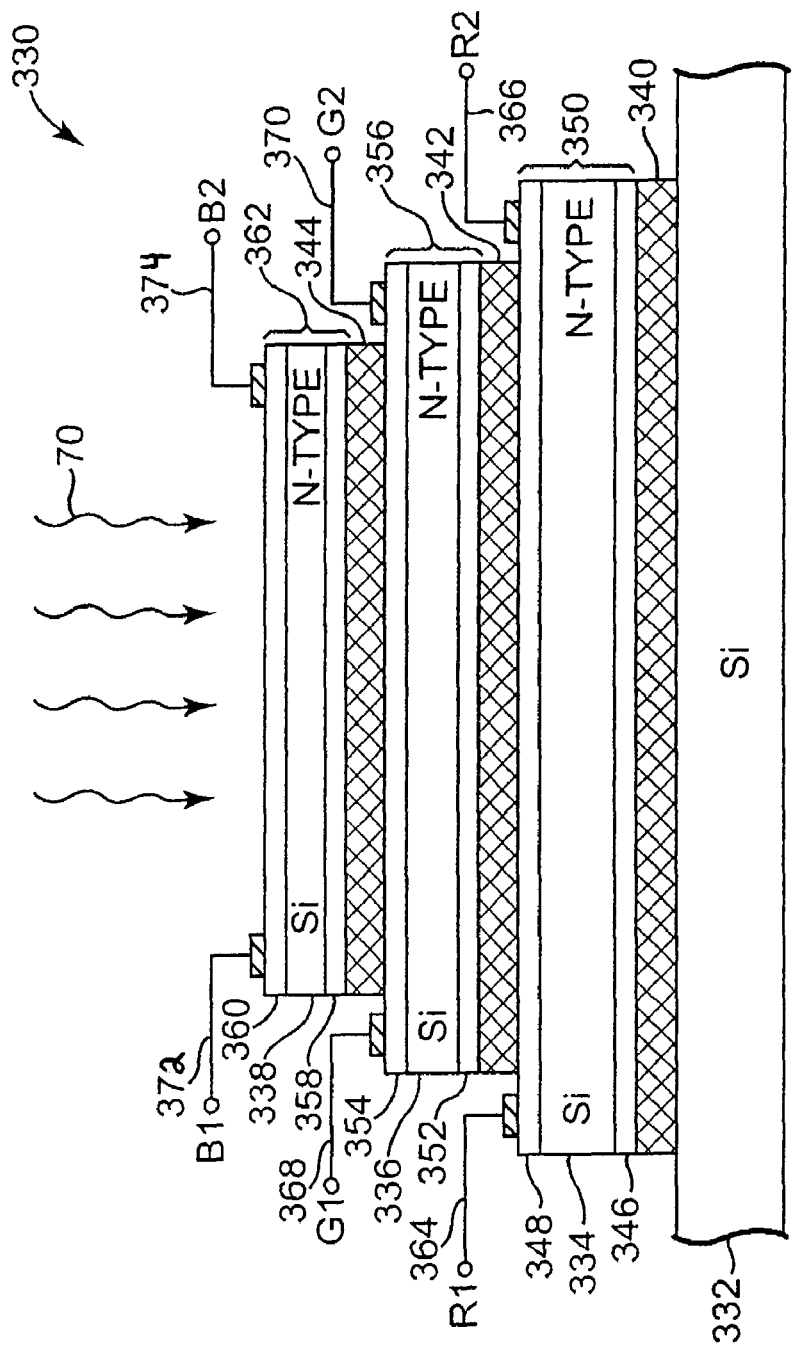
FIG. 7 is block and schematic diagram illustrating one embodiment of a pixel according to the present invention.

FIG. 7 is a block diagram illustrating generally one embodiment of a pixel 330 according to the present invention, wherein each of the semiconductor layers forms a portion of a Fabry-Perot resonator. Pixel 330 includes a substrate 332, a first semiconductor layer 334, a second semiconductor layer 336, and a third semiconductor layer 338, and insulating layer 340, 342, and 344.

In one embodiment, as illustrated by FIG. 7, first, second, and third semiconductor layers each consist of n-type silicon. In one embodiment, first semiconductor layer 334 is configured to absorb mostly red light ($\alpha$ 650 nm), second semiconductor layer 336 is configured to absorb mostly green light ($\alpha$550 nm), and third semiconductor layer 338 is configured to absorb mostly blue light ($\alpha$ 450 nm).

Dielectric layers 346 and 348 are disposed on opposite sides of first semiconductor layer 334 so as to form a first Fabry-Perot cavity or resonator 350. Similarly, dielectric layers 352 and 354 are disposed on opposite sides of second semiconductor layer 336 to from a second Fabry-Perot resonator 356, and dielectric layers 358 and 360 are disposed on opposite sides of third semiconductor layer 338 to form a third Fabry-Perot resonator 362.

As generally known to those in the art, an interface between two materials having different refractive indices will reflect light of a certain wavelength or range of wavelengths based on the refractive indices and depths of the materials. In one embodiment, the refractive indices and depths of third semiconductor layer 338 and dielectric layers 358 and 360 are configured such that wavelengths of incident light 70 corresponding mostly to blue light are reflected and resonate within third semiconductor layer 338 of third Fabry-Perot resonator 362 while passing other wavelengths.

Similarly, the refractive indices and depths of second semiconductor layer 336 and dielectric layers 352 and 354 are configured such that wavelengths of incident light 70 corresponding mostly to green light are reflected and resonate with second semiconductor layer 336 of second Fabry-Perot resonator 356, and the refractive indices and depths of first semiconductor layer 334 and dielectric layers 346 and 348 are configured such that wavelengths of incident light 70 corresponding mostly to red light are reflected and resonate with first semiconductor layer 334 of first Fabry-Perot resonator 350.

Employing first, second, and third Fabry-Perot resonators 350, 356, and 362 to each resonate a desired wavelength or range of wavelengths of incident light 70 as described above enables first, second, and third semiconductor layers 334, 336, and 338 to respectively absorb red, green, and blue light that may have otherwise passed through and not been absorbed.

Lead pairs 364 (R1) and 366 (R2), 368 (G1) and 370 (G2), and 372 (B1) and 374 (B2) are respectively coupled to opposite sides of first, second and third semiconductor layers 334, 336, and 338 via conductive layers 346, 352, and 358, and enable the conductance of the corresponding semiconductor layers to be monitored so as to determine an amount of incident light 70 absorbed by each semiconductor layer during an integration period, such as in a fashion similar to that described above with respect to FIGS. 1 and 4.

Although illustrated and described above as employing pairs of dielectric layers 346 and 348, 352 and 354, and 358 and 360 to respectively form Fabry-Perot resonators 350, 356, and 362, in other embodiments, the Fabry-Perot resonators may be formed without use of such pairs of dielectric materials and using only insulating layers 340, 342, and 344. In such an embodiment, only dielectric layer 360 is employed to form the upper layer of Fabry-Perot resonator 362. For example, in one embodiment, first Fabry-Perot resonator 350 is formed by first semiconductor layer 334 and insulating layers 340 and 342, second Fabry-Perot resonator 356 is formed by second semiconductor layer 336 and insulating layers 342 and 344, and third Fabry-Perot resonator 362 is formed by third semiconductor layer 338, insulating layer 344, and dielectric layer 360. In such an embodiment, the depths and composition of semiconductor layers 334, 336 and 338, insulating layers 340, 342 and 344, and dielectric layer 360 are selected and configured such that each of the Fabry-Perot resonators reflect and resonate the desired range of wavelengths of incident radiation.

Figure 8:
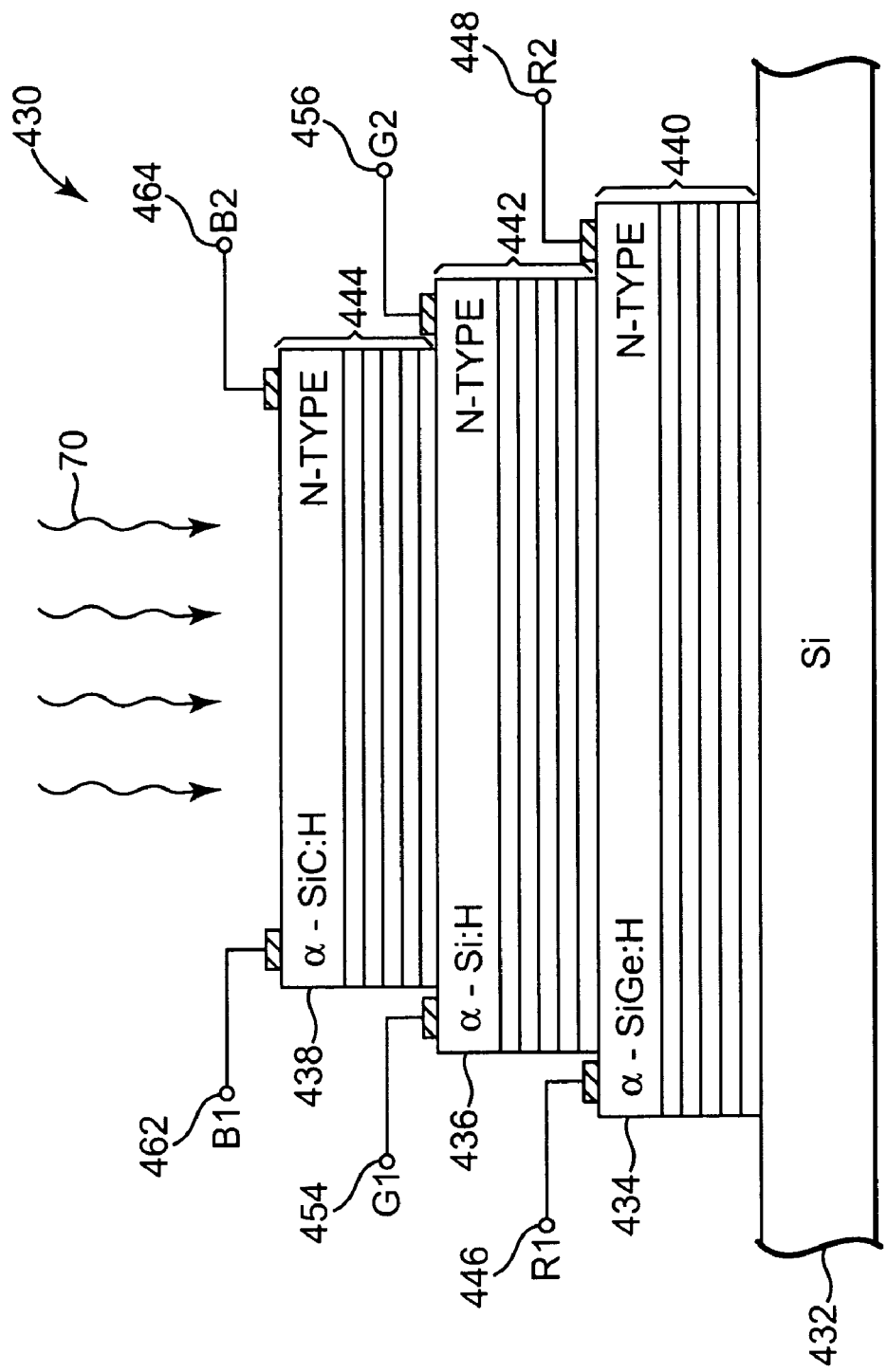
FIG. 8 is a block and schematic diagram illustrating one embodiment of a pixel according to the present invention.

FIG. 8 is a block diagram illustrating generally one embodiment of a 3-color (RGB) pixel 430 according to the present invention employing interference filters. Pixel 430 includes a substrate 432, a first semiconductor layer 434, a second semiconductor layer 436, and a third semiconductor layer 438. In one embodiment, first semiconductor layer 434 is configured to absorb mostly red light ($\alpha$ 650 nm), second semiconductor layer 436 is configured to absorb mostly green light ($\alpha$ 550 nm), and third semiconductor layer 438 is configured to absorb mostly blue light ($\alpha$ 450 nm). A first interference filter 440 is deposited between first semiconductor layer 434, a second interference filter 442 is deposited between first and second semiconductor layers 434 and 436, and a third interference filter 444 is deposited between second and third semiconductor layers 436 and 438.

As described above, and as generally known to those in the art, an interface between two materials having different refractive indices will reflect light of a certain wavelength or range of wavelengths based on the refractive indices and depths of the materials. In one embodiment, as illustrated in FIG. 8, first, second, and third interference filters 440, 442, and 444 each comprise alternating layers of different dielectric materials having differing refractive indices (i.e., one of the dielectric materials has a higher refractive index than the other dielectric material). In one embodiment, first, second, and third interference filter 440, 442, and 444 each consist of alternating layers of silicon oxide ($SiO_2$) and silicon nitride ($Si_3N_4$).

In one embodiment, the refractive indices, depths, and numbers of alternating layers of third interference filter 444 are configured such that third interference filter 444 reflects wavelengths of incident light 70 corresponding mostly to blue light into third semiconductor layer 438 while allowing substantially all other wavelengths pass through. Similarly, the refractive indices, depths, and numbers of alternating layers of second interference filter 442 are configured so as to reflect wavelengths of incident light 70 corresponding mostly to green light into second semiconductor layer 436, and the refractive indices, depths, and numbers of alternating layers of first interference filter 440 are configured so as to reflect wavelengths of incident light 70 corresponding mostly to red light into first semiconductor layer 434.

Employing first, second, and third interference filters 440, 442, and 444 to reflect a desired wavelength or range of wavelengths of incident light 70 as described above enables first, second, and third semiconductor layers 434, 436, and 438 to respectively absorb red, green, and blue light that may have otherwise passed through and not been absorbed.

Lead pairs 446 (R1) and 448 (R2), 454 (G1) and 456 (G2), and 462 (B1) and 464 (B2) are respectively coupled to opposite sides of first, second and third semiconductor layers 434, 436, and 438 and enable the conductance of the corresponding semiconductor layers to be monitored so as to determine an amount of incident light 70 absorbed by each semiconductor layer during an integration period, such as in a fashion similar to that described above with respect to FIGS. 1 and 4.

Figure 9:
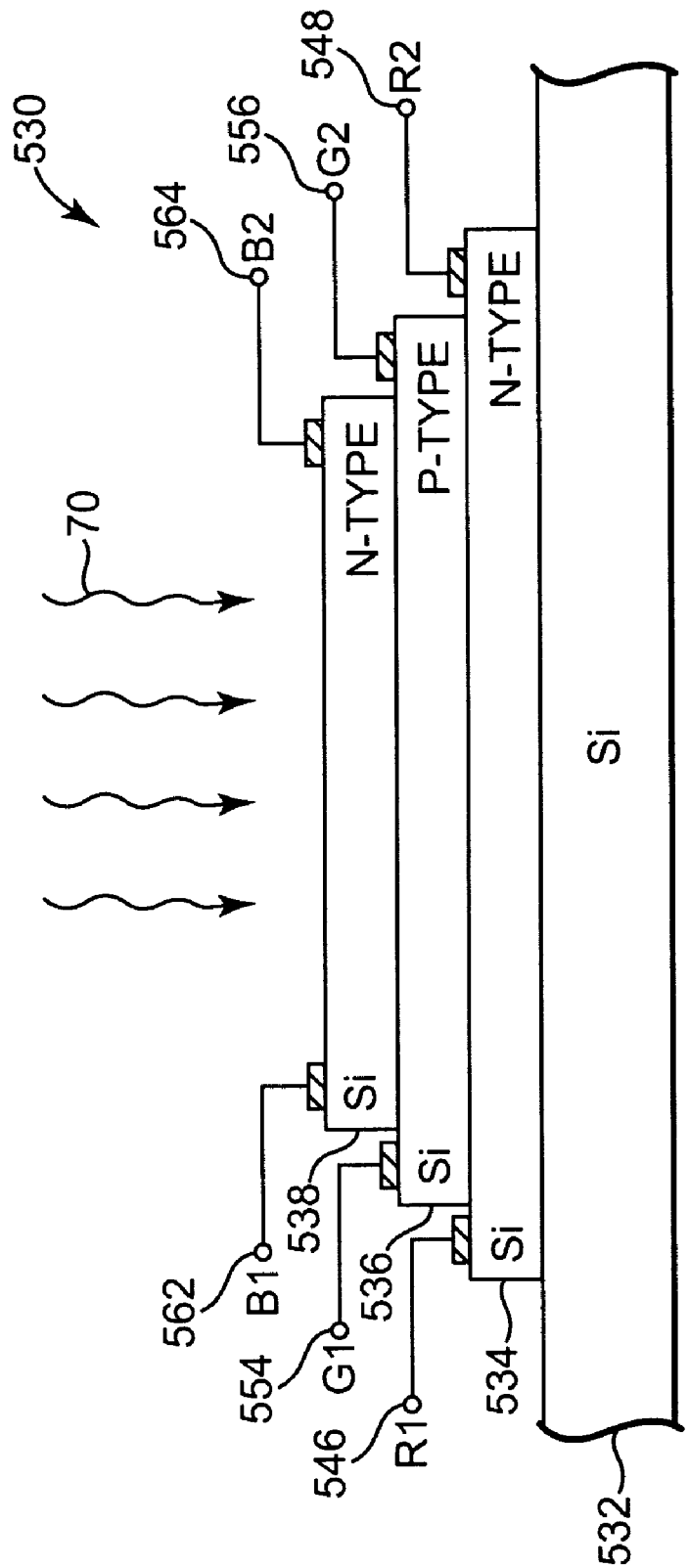
FIG. 9 is block and schematic diagram illustrating one embodiment of a pixel according to the present invention.

FIG. 9 is a block diagram illustrating generally one embodiment of a pixel 530 according to the present invention employing p-n junctions to isolate photoconductive layers in lieu of insulating layers. Pixel 530 includes a substrate 532, a first semiconductor layer 534, a second semiconductor layer 536, and a third semiconductor layer 538. In one embodiment, first semiconductor layer 534 is configured to absorb mostly red light ($\alpha$ 650 nm), second semiconductor layer 536 is configured to absorb mostly green light ($\alpha$550 nm), and third semiconductor layer 538 is configured to absorb mostly blue light ($\alpha$ 450 nm).

First, second, and third semiconductor layers 534, 536, and 538 consist of alternating p-type and n-type semiconductor materials such that a p-n junctions are formed at the interface regions between first and second semiconductor layers 534 and 536, and between second and third semiconductor layers 536 and 538. The depletion regions formed by the p-n junctions "self-isolate" first and second semiconductor layers 534 and 536 and second and third semiconductor layers 536 and 538. In one embodiment, as illustrated, first and third semiconductor layers 534 and 538 comprise n-type silicon and second semiconductor layer 536 comprises p-type silicon.

However, first, second, and third semiconductor layers 534, 536, and 538 may consist of other suitable n-type and p-type semiconductors.

Lead pairs 546 (R1) and 548 (R2), 554 (G1) and 556 (G2), and 562 (B1) and 564 (B2) are respectively coupled to opposite sides of first, second and third semiconductor layers 534, 536, and 538 and enable the conductance of the corresponding semiconductor layers to be monitored so as to determine an amount of incident light 70 absorbed by each semiconductor layer during an integration period, such as in a fashion similar to that described above with respect to FIGS. 1 and 4.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A pixel, comprising:
    a substrate;
    a plurality of photoconductive layers sequentially deposited on and substantially parallel to the substrate and configured to receive incident electromagnetic radiation, wherein each photoconductive layer is configured to absorb a different range of wavelengths of incident electromagnetic radiation and configured to provide an indication to a respective readout circuit of an amount of incident electromagnetic radiation absorbed by the layer based on a change in the resistance of the layer;
    a plurality of insulating layers disposed between successive photoconductive layers and between a bottom-most photoconductive layer of the plurality of photoconductive layers and the substrate, each photoconductive layer has a top surface and a bottom surface and the insulating layers are configured such that one of the insulating layers is in contact with the bottom surface of one photoconductive layer and the top surface of the next photoconductive layer; and
    a plurality of contacts, one respective contact disposed on each of at least two end portions of a surface of each photoconductive layer, each contact having a lead coupled to it and disposed so as to couple the respective readout circuit to each of the plurality of photoconductive layers, each respective readout circuit including a readout capacitor and a transistor coupled in series with one of the photoconductive layers,
    wherein the range of wavelengths absorbed by each respective photoconductive layer depends at least on a distance between the respective photoconductive layer and the substrate.

2. The pixel of claim 1, wherein each photoconductive layer comprises a semiconductor material.

3. The pixel of claim 2, wherein the semiconductor material comprises amorphous hydrogenated silicon.

4. The pixel of claim 1, wherein a pair of dielectric layers are deposited parallel to and on opposite surfaces of each photoconductive layer such that each photoconductive layer and the corresponding pair of dielectric layers form a Fabry-Perot resonator configured to resonate wavelengths of electromagnetic radiation within the range of wavelengths configured to be absorbed by the photoconductive layer.

5. The pixel of claim 1, wherein an interference filter is disposed on and parallel to a surface of each photoconductive layer which is opposite a surface upon which the incident electromagnetic radiation impinges, wherein each interference filter is configured to reflect substantially all wavelengths of electromagnetic radiation within the range of wavelengths configured to be absorbed by the corresponding photoconductive layer and to pass substantially all other wavelengths of electromagnetic radiation.

6. The pixel of claim 1, wherein each photoconductive layer comprises a same semiconductor material, and wherein a layer depth of each photoconductive layer increases with increasing proximity to the substrate such that a first photoconductive layer of the plurality of photoconductive layers which is closest to the substrate has the deepest layer depth and a last photoconductive layer of the plurality of photoconductive layers which is furthest from the substrate has the shallowest layer depth.

7. The pixel of claim 1, wherein each photoconductive layer comprises a different semiconductor material, and wherein a bandgap energy of the semiconductor material of each photoconductive layer decreases with increasing proximity to the substrate such that a first photoconductive layer of the plurality of photoconductive layers which is closest to the substrate has the lowest bandgap energy and a last photoconductive layer of the plurality of photoconductive layers which is furthest from the substrate has the highest bandgap energy.

8. The pixel of claim 1, wherein the pixel is formed using thin-film deposition techniques.

9. The pixel of claim 1, further including a readout circuit disposed in the substrate below the photoconductive layers, wherein the readout circuit is coupled to each photoconductive layer and configured to provide an indication of the amount of electromagnetic radiation absorbed by each layer during the integration period based on a change in the conductivity of each layer.

10. The pixel of claim 1, wherein the plurality of photoconductive layers comprise alternating p-type and n-type layers of a same semiconductor material.

11. The pixel of claim 1, wherein the plurality of photoconductive layers are configured to absorb wavelengths of electromagnetic radiation from a visible portion of the electromagnetic spectrum.

12. The pixel of claim 1, wherein the plurality of photoconductive layers are configured to absorb wavelengths of electromagnetic radiation from an infrared portion of the electromagnetic spectrum.

13. The pixel of claim 1, wherein the plurality of photoconductive layers are configured to absorb wavelengths of electromagnetic radiation from an ultraviolet portion of the electromagnetic spectrum.

14. A color pixel, comprising:
    a substrate;
    a first, a second, and a third semiconductor layer deposited on the substrate such that the first semiconductor layer is positioned nearest the substrate and the second semiconductor layer is positioned between the first and third semiconductor layers, wherein the first semiconductor layer is configured to absorb a range of wavelengths of an incident light corresponding to red light, the second semiconductor layer is configured to absorb a range of wavelengths of the incident light corresponding to green light, and the third semiconductor layer is configured to absorb a range of wavelengths of the incident light corresponding to blue light, and wherein the first, second and third semiconductor layers are each configured to provide an indication to a respective readout circuit of the amount of incident light absorbed within the corresponding range of wavelengths based on a change in resistance of the layer;

a plurality of insulating layers disposed between successive photoconductive layers and between a bottom-most photoconductive layer of the plurality of photoconductive layers and the substrate, each photoconductive layer has a top surface and a bottom surface and the insulating layers are configured such that one of the insulating layers is in contact with the bottom surface of one photoconductive layer and the top surface of the next photoconductive layer; and a plurality of contacts, one respective contact disposed on each of at least two end portions of a surface of each photoconductive layer, each contact having a lead coupled to it and disposed so as to couple the respective readout circuit to each of the plurality of photoconductive layers, each respective readout circuit including a readout capacitor and a transistor coupled in series with one of the photoconductive layers, wherein the range of wavelengths absorbed by each respective photoconductive layer depends at least on a distance between the respective photoconductive layer and the substrate.

15. The color pixel of claim 14, wherein the first, second, and third semiconductor layers each comprise a same semiconductor material.

16. The color pixel of claim 15, wherein the first semiconductor layer has a thickness greater than a thickness of the second semiconductor layer and the second semiconductor layer has a thickness greater than the third semiconductor layer.

17. The color pixel of claim 14, wherein the first, second and third semiconductor layers each comprise a different semiconductor material, and wherein the first semiconductor layer has a bandgap energy less than a bandgap energy of the second semiconductor layer, and the second semiconductor layer has a bandgap energy less than the third semiconductor layer.

18. A color image sensor comprising an array of pixels, wherein each pixel comprises:

a substrate;

a plurality of photoconductive layers sequentially deposited on and substantially parallel to the substrate and configured to receive incident electromagnetic radiation, wherein each photoconductive layer is configured to absorb a different range of wavelengths of the incident electromagnetic radiation and configured to provide an indication to a respective readout circuit of an amount of incident electromagnetic radiation absorbed by the layer based on a change in resistance of the layer;

a plurality of insulating layers disposed between successive photoconductive layers and between a bottom-most photoconductive layer of the plurality of photoconductive layers and the substrate, each photoconductive layer has a top surface and a bottom surface and the insulating layers are configured such that one of the insulating layers is in contact with the bottom surface of one photoconductive layer and the top surface of the next photoconductive layer; and a plurality of contacts, one respective contact disposed on each of at least two end portions of a surface of each photoconductive layer, each contact having a lead coupled to it and disposed so as to couple the respective readout circuit to each of the plurality of photoconductive layers, each respective readout circuit including a readout capacitor and a transistor coupled in series with one of the photoconductive layers, wherein the range of wavelengths absorbed by each respective photoconductive layer depends at least on a distance between the respective photoconductive layer and the substrate.

19. The color image sensor of claim 18, wherein each of the pixels share a common substrate.

20. A method of operating a pixel, the method comprising:
receiving incident electromagnetic radiation;
absorbing a plurality of different ranges of wavelengths of the incident electromagnetic radiation with a corresponding plurality of photoconductive layers, wherein the photoconductive layers are vertically arranged relative to the incident electromagnetic radiation and relative to a substrate and wherein each photoconductive layer exhibits a resistance along the photoconductive layer;

determining an amount of electromagnetic radiation absorbed within each of the plurality of different ranges of wavelengths by charging a respective capacitor having a first end coupled to the corresponding photoconductive layer by selectively applying a reference potential to a second end of the capacitor; and reading out the charge accumulated on the capacitor to determine the amount of radiation absorbed by the corresponding photoconductive layer.

21. The method of claim 20, wherein absorbing a plurality of different ranges of wavelengths comprises absorbing a plurality of different ranges of wavelengths from a visible portion of the electromagnetic spectrum.

22. The method of claim 21, wherein absorbing a plurality of different ranges of wavelengths includes:
absorbing a range of wavelengths corresponding to red light with a first photoconductive layer;
absorbing a range of wavelengths corresponding to green light with a second photoconductive layer; and
absorbing a range of wavelengths corresponding to blue light with a third photoconductive layer, wherein the photoconductive layers are arranged such that the first photoconductive layer is furthest from a source of the incident electromagnetic radiation and the third photoconductive layer is nearest to the source of the incident electromagnetic radiation.

23. The method of claim 20, wherein absorbing a plurality of different ranges of wavelengths comprises absorbing a plurality of different ranges of wavelengths from an infrared portion of the electromagnetic spectrum.

24. The method of claim 20, wherein absorbing a plurality of different ranges of wavelengths comprises absorbing a plurality of different ranges of wavelengths from an ultraviolet portion of the electromagnetic spectrum.

25. A pixel, comprising:
a substrate;
plurality of photoconductive layers sequentially deposited on and substantially parallel to the substrate and configured to receive incident electromagnetic radiation, wherein each photoconductive layer is configured to absorb a different range of wavelengths of incident electromagnetic radiation and configured to provide an indication to a respective readout circuit of an amount of incident electromagnetic radiation absorbed by the layer based on a change in resistance of the layer;

a plurality of interference filters disposed between successive photoconductive layers and between a bottom-most photoconductive layer of the plurality of photoconductive layers and the substrate, each photoconductive layer has a top surface and a bottom surface and the interference filters are configured such that one of the interference filters is in contact with the bottom surface of one photoconductive layer and the top surface of the next photoconductive layer; and a plurality of contacts, one respective contact disposed on each of at least two end portions of a surface of each photoconductive layer, each contact having a lead coupled to it and disposed so as to couple the respective readout circuit to each of the plurality of photoconductive layers, each respective readout circuit including a readout capacitor and a transistor couple in series with one of the photoconductive layers, wherein the range of wavelengths absorbed by each respective photoconductive layer depends at least on a distance between the respective photoconductive layer and the substrate.

* * * * *